US006207288B1

(12) United States Patent
Bloom

(10) Patent No.: US 6,207,288 B1
(45) Date of Patent: Mar. 27, 2001

(54) COPPER INK FOR ALUMINUM NITRIDE

(75) Inventor: Terry Bloom, Middlebury, IN (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 07/924,591

(22) Filed: Aug. 8, 1992

Related U.S. Application Data

(63) Continuation of application No. 07/650,960, filed on Feb. 5, 1991.

(51) Int. Cl.[7] .................................................. B32B 18/00
(52) U.S. Cl. ........................ 428/472; 428/457; 428/469; 428/698; 428/701; 428/702
(58) Field of Search ................................... 428/698, 472, 428/469, 697, 432, 701, 702, 457

(56) References Cited

U.S. PATENT DOCUMENTS

| | | | |
|---|---|---|---|
| 4,299,876 | * 11/1981 | Neuhoff et al. | 428/210 |
| 4,409,261 | * 10/1983 | Kuo | 428/208 |
| 4,436,785 | * 3/1984 | Dietz et al. | 428/210 |
| 4,521,329 | 6/1985 | Siuta et al. | 252/512 |
| 4,536,435 | * 8/1985 | Utsumi et al. | 428/901 |
| 4,623,482 | * 11/1986 | Kuo et al. | 428/209 |
| 4,659,611 | * 4/1987 | Iwase et al. | 428/698 |
| 4,714,645 | * 12/1987 | Kawasumi | 428/469 |
| 4,756,976 | * 7/1988 | Komeya et al. | 428/698 |
| 4,840,853 | * 6/1989 | Iio et al. | 428/699 |
| 4,863,658 | 9/1989 | Sugiura et al. | 264/65 |
| 4,882,212 | * 11/1989 | Singh Deo et al. | 428/704 |
| 4,892,703 | * 1/1990 | Iio et al. | 428/457 |
| 4,906,514 | 3/1990 | Francis et al. | 428/209 |
| 5,057,376 | 10/1991 | Sunahara et al. . | |
| 5,063,121 | 11/1991 | Sato et al. . | |
| 5,085,923 | * 2/1992 | Yamakawa et al. | 428/698 |
| 5,087,509 | 2/1992 | Kuromitsu et al. | 428/195 |
| 5,089,172 | 2/1992 | Allison et al. | 252/512 |
| 5,096,768 | 3/1992 | Kuromitsu et al. | 428/209 |
| 5,150,830 | 9/1992 | Guinet et al. | 228/124 |
| 5,152,931 | 10/1992 | Alexander | 252/512 |
| 5,159,432 | 10/1992 | Ohkubo et al. | 357/74 |
| 5,164,246 | 11/1992 | Tanaka et al. | 428/209 |
| 5,164,885 | 11/1992 | Drye et al. | 361/387 |
| 5,165,983 | 11/1992 | Sigiura et al. | 428/141 |
| 5,165,986 | 11/1992 | Gardner et al. | 428/209 |

OTHER PUBLICATIONS

John B. Blum, "Aluminum Nitride Substrates for Hybrid Microelectronic Applicantions"—Hybrid Circuit Technology, Aug. 1989, pp. 7 thru 14.

A. Mohammed, A. Abdo, G. Scarlett and F. Sherrima, "Effect of Lot Variations on the Manufacturability of Thick and Thin Film Aln Substrates"—ISHM '90 Proceedings, pp. 7 thru 12.

Y. Kuromitsu, T. Nagase, H. Yoshida, F. Miyazawa, Y. Ikeda, "Evaluation of the Hybrid made of Surface Treated AlN Substrate" ISHM '90 Proceedings—pp. 19 thru 26.

K. Kachelries, J. Olenick and S. Konsowski, "Evaluation of Thick Film Multi–Layers on AlN"—ISHM '88 Proceedings—pp. 170 thru 182.

J. Ishigame, T. Kubota, S. Sekihara and K. Fujimura, "Technological Advances of Thick Film Resistors for Aluminum Nitride Substrates with New Conductive Compositions"—ISHM '88 Proceedings—pp. 349 thru 357.

Guy Ackerman, Dana L. Hankey, "Effects of Laser Trimming Thick Film Resistor Materials on Aluminum Nitride Substrates"—Proceedings of 2nd ASM International Apr. 24–28, 1989 pp. 231 thru 239 (Odd pages only).

E. S. Dettmer and H. K. Charles, Jr., "High Reliability Thick Film Development Considerations for Aluminum Nitride Substrates"—ISHM '87 Proceedings—pp. 19 thru 29.

C. V. Cox, M. J. Huftless, etal, "A New Thick Film Materials System for Aluminum Nitride"—International Journal for Hybrid Microelectronics, V10, N3, 3rd Qtr. 1987—pp. 8 thru 12.

Electronic Materials Division, Ferro Corporation—News Release: "Thick Film Materials Developed for Aluminum Nitride Substrates"—Oct. 1988—1 pg.

ISHM Proc., 1985—Anwar A. Mohammed and Steven J. Corbett, "Thick Film Metallizations and Performance of a Power Hybrid Module on Aluminum Nitride Substrates" 1985—pp. 218 thru 224.

E. S. Dettmer and H. K. Charles, Jr., "Fundamental Characterization of Aluminum Nitride and Silicon Carbide for Hybrid Substrates Applications"—International Journal for Hybrid Microelectronics, 2nd Qtr. 1987, V10, N2—pp. 9 thru 18 Journal.

N. Iwase and K. Anzai, "Aluminum Nitride Substrates Having High Thermal Conductivity"—Solid State Technology, Oct. 1986—pp. 135 thru 138.

*Ceramic Glazes* Parmalee, Cullen W., International Publications, Inc., Chicago, 1951, pp. 24–26, 30–34. (No Month).

*Handbook of Glass Manufacture*, Jay V. Tooley, ed. Ogden Publishing Company, New York, 1953, pp. 57, 60–4, 73 (No Month).

*Glass–Ceramics*, McMillan, P.W., Academic Press, London, 1964, pp. 17–19, 23–3. (No Month).

Iwase et al—"Thick Film and Direct Bond Copper Forming Technologies for Aluminum Nitride Substrate"—IEEE Transactions on Components, Hybride and Manufacturing Technology, Vo. Chmt 8, No. 2, Jun., '85—pp. 253 thru 258.

\* cited by examiner

*Primary Examiner*—Archene Turner
(74) *Attorney, Agent, or Firm*—Mark P. Bourgeois; Mark W. Borgman

(57) ABSTRACT

A copper conductor formulation which exhibits outstanding properties when fired upon an aluminum nitride substrate is disclosed. The conductor formulation primarily includes copper and further includes oxygen-bearing copper, lead monoxide containing glass and a screening agent. A conductor formed in accord with the invention exhibits outstanding properties including initial and aged adhesion, conductivity and solderability.

1 Claim, No Drawings

COPPER INK FOR ALUMINUM NITRIDE

This application is a continuation of Ser. No. 07/650,960 filed Feb. 5, 1991.

BACKGROUND OF THE INVENTION

1. Field of the Invention

This invention pertains to electrically conductive compositions in general, and specifically to thick film copper and glass containing conductives formulated for screen printing application on aluminum nitride substrates.

2. Description of the Related Art

Modern electronic circuits are almost exclusively assembled via printed wiring substrates. These substrates eliminate the need for the "rat's nest" of wires that abound with discretely wired circuitry and improve the yield of assembled circuitry because the wiring boards improve the consistency of device interconnection. Additionally, wiring boards have encouraged miniaturization by providing size benefit as well as signal integrity that might otherwise be compromised on higher frequency circuitry.

Wiring substrates for commercial applications are typically fabricated from a polymer material such as epoxy or polyimide which may be cast or laminated into the desired configuration. The polymer materials are desirable because of low cost and the relative ease of general processing but have drawbacks in thermal characteristics such as maximum exposure temperature, maximum operating temperature, thermal coefficient of expansion, and thermal conductivity. Polymer substrates also may suffer from poor aged performance, mechanical strength and rigidity and other factors.

Where polymer wiring substrates have proved to be ineffective in meeting the demands of an application, the electronics industry has generally relied upon either alumina, porcelain or glass, or beryllia substrates. These substrates typically have better performance in many of the areas that prevent the use of polymer substrates. However, as with most things in the real world, these substrates are not also without particular limitation. For example, beryllia is a very good thermal conductor having high mechanical strength. Unfortunately, beryllia is also very toxic if inhaled in dust form. Exposure to beryllia dust is now restricted in the work place in many countries around the world.

Aluminum nitride, only recently commercially viable, has many properties much more desirable than those heretofore known compositions. Aluminum nitride has thermal conductivity comparable to beryllia without the toxicity. Aluminum nitride has mechanical strength and chemical stability that is comparable to other ceramic substrates. Particularly advantageous is the thermal coefficient of expansion of this material, which very closely corresponds to the thermal coefficient of expansion of silicon, allowing for the mounting of semiconductor devices that are required to endure many thermal cycles without separating from the wiring substrate. When the high thermal conductivity of the material is considered in concert with a thermal coefficient of expansion matching silicon, the application to high power semiconductor circuits in small, high reliability packages becomes apparent.

In spite of the many advantages aluminum nitride has to offer, there are again some drawbacks. Principal among the heretofore limitations of aluminum nitride is the fact that the substrate is a non-oxide substrate. The use of a non-oxide substrate limits the selection of conductive and resistive materials suitable for application to the substrate and limits the method of application. Some of the formulations previously used with alumina react too vigorously with aluminum nitride or in other cases fail to generate any chemical adhesion whatsoever. For example, in the hybrid industry most circuits are formed upon alumina substrates using a thick film screen printing process. The screen printing process is favored where suitable over vapor deposition processes because of the lower costs of production involved.

However, the use of aluminum nitride has previously required either the use of precious metal formulations which are necessarily expensive and which are not good conductors, owing to the relatively poor intrinsic conductivity of the materials and the high price those precious metals are sold for on the open market, or the use of expensive vapor deposition processes using materials such as tungsten and molybdenum. The advantages offered by a copper-based screen printable conductive are well described in U.S. Pat. No. 4,186,615, incorporated herein by reference, which discusses the application of copper to oxide-based substrates. While heretofore known formulations were not found to be suitable for use on an aluminum nitride substrate, there is a place and a need for a copper conductor formed upon aluminum nitride.

SUMMARY OF THE INVENTION

Copper conductor inks fully compatible with aluminum nitride substrates and with low associated materials cost which are intrinsically very conductive are disclosed herein. These conductor inks contain lead oxide which evokes a reaction with the aluminum nitride substrate, thereby producing a chemically bound and highly adherent conductor. These copper conductors bring forth all the advantages associated with aluminum nitride substrates, owing to the high thermal conductivity and high electrical conductivity of the resultant copper conductor while retaining the low costs associated with base metal materials.

DESCRIPTION OF THE PREFERRED EMBODIMENT

Copper in the preferred embodiment is derived from a mixture of pure copper and either cupric oxide or copper hydroxide. The preferred level of copper is approximately 77 parts by weight and the oxygen bearing copper should comprise approximately 15 parts by weight. Eight parts by weight are a glass frit containing lead monoxide, boric oxide and silica. These "active" agents may then be blended with approximately 14 parts by weight suitable screening agent, yielding a formulation well suited for screening onto an aluminum nitride substrate. The element is then fired in a nitrogen atmosphere to a peak temperature of 880° C. yielding a well adhered, defect free conductor.

While the suitable "active" ingredient percentage levels for oxygen-bearing copper vary from approximately 8% cupric oxide and from approximately 15% copper hydroxide, these are only minimum levels and levels of 23% cupric oxide and 30% copper hydroxide do not appear to significantly adversely affect adhesion to aluminum nitride. However, as the oxygen-bearing copper content rises, solderability of resultant conductors worsens. The present preference is for levels of about 15% cupric oxide and about 25% copper hydroxide.

Glass levels also are somewhat variable, although less so than for oxygen-bearing copper. Where 25% copper hydroxide is used, levels of only 2% glass have been determined to be adequate, with levels at least to 8% performing satisfactorily. Where 15% cupric oxide is used, glass levels from 4 to 12 percent have performed satisfactorily, with 8% being preferred.

A critical component of the preferred embodiment is the glass composition. The glass used in each of the above examples was comprised by 80% by weight lead monoxide, 10% by weight boric oxide, and 10% by weight silica. Very small changes in this formulation have been found to improve the initial adhesion of the fired conductive, but only at the significant expense of aged adhesion performance. Example 1 illustrates the variability introduced by changing the glass composition.

The use of lead oxide in the present formulation, especially at these very high levels, is believed to be very novel since much literature has been directed to problems associated with the use of lead-bearing glasses in association with aluminum nitride and the resultant attempts by others to use lead-free compositions. The fact that the preferred embodiment has such outstanding characteristics serves to question the teachings of the prior art.

EXAMPLES

In the following example, an ink was formulated from 77 parts copper, 15 parts cupric oxide, and 8 parts glass. 14 parts screening agent which included pine oil, Elvacite and CO-430 was added to provide appropriate rheology, and the formulation was screened upon an aluminum nitride substrate. The substrate was then fired, and initial adhesion tested for some of the samples. The remaining samples were then aged in air at 150° C. for 1000 hours and adhesion was tested.

| Glass Composition | | | |
|---|---|---|---|
| PbO | B2O3 | SiO2 | Initial/Aged adhesion |
| 85 | 7.5 | 7.5 | 7.8/3.0 |
| 84 | 5 | 11 | 7.7/1.9 |
| 84 | 11 | 5 | 7.6/2.7 |
| 80 | 10 | 10 | 7.1/4.6 |
| 76 | 15 | 9 | 6.5/3.9 |
| 76 | 9 | 15 | 5.1/2.8 |
| 70 | 12.5 | 12.5 | 5.1/1.6 |

While the foregoing details what is felt to be the preferred embodiment of the invention, no material limitations to the scope of the claimed invention is intended. Further, features and design alternatives that would be obvious to one of ordinary skill in the art are considered to be incorporated herein. The scope of the invention is set forth and particularly described in the claims hereinbelow.

I claim:

1. A conductive composition chemically bonded to an aluminum nitride substrate, said conductive composition comprising a first metallic conductive material and an adhering means chemically reacted with the aluminum nitride in said substrate for adhering to said conductive material and to said substrate, said adhering means comprising a glass frit which consists of 80 weight % lead monoxide, 10 weight % boron oxide and 10 weight % silica.

* * * * *